(12) United States Patent
Schmidt et al.

(10) Patent No.: US 9,807,895 B2
(45) Date of Patent: Oct. 31, 2017

(54) SEAL FOR A HOUSING OF AN ELECTRONIC CIRCUIT ARRANGEMENT

(71) Applicant: CONTI TEMIC MICROELECTRONIC GMBH, Nuremberg (DE)

(72) Inventors: Thomas Schmidt, Burglengenfeld (DE); Bernhard Schuch, Neusitz (DE); Jan Zenichowski, Pommelsbrunn (DE)

(73) Assignee: Conti Temic microelectronic GmbH, Nuremberg (DE)

( * ) Notice: Subject to any disclaimer, the term of this patent is extended or adjusted under 35 U.S.C. 154(b) by 0 days.

(21) Appl. No.: 15/027,785

(22) PCT Filed: Nov. 28, 2014

(86) PCT No.: PCT/EP2014/075935
§ 371 (c)(1),
(2) Date: Apr. 7, 2016

(87) PCT Pub. No.: WO2015/086341
PCT Pub. Date: Jun. 18, 2015

(65) Prior Publication Data
US 2016/0249465 A1    Aug. 25, 2016

(30) Foreign Application Priority Data
Dec. 10, 2013  (DE) ........................ 10 2013 225 441

(51) Int. Cl.
*H05K 5/06* (2006.01)
*H01L 23/48* (2006.01)
(Continued)

(52) U.S. Cl.
CPC ....... *H05K 5/0082* (2013.01); *F16H 61/0006* (2013.01); *F16H 61/0204* (2013.01); *H05K 5/0247* (2013.01); *H05K 5/062* (2013.01)

(58) Field of Classification Search
CPC ........ H05K 5/0247; H05K 5/06; H05K 5/061; H05K 5/062; H05K 5/063; H05K 5/064;
(Continued)

(56) References Cited

U.S. PATENT DOCUMENTS

| 4,546,412 A | 10/1985 | Nakazawa et al. |
| 5,061,193 A | 10/1991 | Seaman |

(Continued)

FOREIGN PATENT DOCUMENTS

| DE | 10340974 A1 | 3/2005 |
| DE | 102004018488 A1 | 11/2005 |

(Continued)

*Primary Examiner* — Chau N Nguyen
*Assistant Examiner* — Roshn Varghese
(74) *Attorney, Agent, or Firm* — Laurence A. Greenberg; Werner H. Stemer; Ralph E. Locher

(57) ABSTRACT

A housing for an electronic circuit configuration includes a housing seal disposed on an inner surface of the housing, integrally bonded to at least one outer housing wall and made of a liquid silicone elastomer. An electrical connecting element extends from the interior of the housing through an outer housing wall and out of the housing. A space between the outer housing wall and the electrical connecting element is sealed by the housing seal.

9 Claims, 1 Drawing Sheet

(51) Int. Cl.
  *H01L 23/045* (2006.01)
  *H01L 23/055* (2006.01)
  *H05K 5/00* (2006.01)
  *H05K 5/02* (2006.01)
  *F16H 61/00* (2006.01)
  *F16H 61/02* (2006.01)

(58) Field of Classification Search
  CPC ........ H05K 5/065; H05K 5/066; H05K 5/067;
       H05K 5/068; H05K 5/069; H05K 5/0082;
           H05K 5/0095; H01L 23/10
  USPC .......... 174/50, 56, 50.6, 528, 529, 539, 540,
                174/17.05, 564; 439/926
  See application file for complete search history.

(56) References Cited

U.S. PATENT DOCUMENTS

| | | | |
|---|---|---|---|
| 5,989,719 A | 11/1999 | Loiselle | |
| 7,193,852 B2 | 3/2007 | Wetzel | |
| 7,473,845 B2 | 1/2009 | Berchtold et al. | |
| 7,763,811 B2 * | 7/2010 | Wetzel | H01L 21/50 |
| | | | 174/539 |
| 2006/0023431 A1 | 2/2006 | Wetzel | |
| 2008/0087463 A1 * | 4/2008 | Ingenbleek | H05K 5/061 |
| | | | 174/564 |

FOREIGN PATENT DOCUMENTS

| | | |
|---|---|---|
| DE | 102007045157 A1 | 4/2009 |
| EP | 0125619 A2 | 11/1984 |
| EP | 0375271 B1 | 6/1990 |
| JP | 2006515115 A | 5/2006 |
| WO | 2004084598 A1 | 9/2004 |

* cited by examiner

SEAL FOR A HOUSING OF AN ELECTRONIC CIRCUIT ARRANGEMENT

BACKGROUND OF THE INVENTION

Field of the Invention

The invention relates to a housing for an electronic circuit arrangement and a method for sealing a housing for an electronic circuit arrangement. Furthermore, the invention relates to a transmission control device and a transmission.

Control devices generally comprise a number of electronic components that are connected to other components outside the control device. In order to provide protection against environmental influences and mechanical influences, electronic circuits of control devices are frequently installed in housings. In order to connect electronic circuits of this type to electrical components outside the control device, it is therefore necessary to provide an electrical leadthrough out of the respective housing.

Particularly when manufacturing transmissions for the automotive industry, control devices for automatic transmissions are currently directly installed both on the transmission and in the transmission. These control devices are also generally protected by means of housings. The housings are equipped in each case with corresponding conductor leadthroughs. In order to protect the electronic components against aggressive media, fluctuating pressure and fluctuating temperatures in the range of −40 to 150° C., these leadthroughs are additionally sealed by means of suitable sealing means.

It is possible to connect electronic components that are arranged in the interior of a housing to components outside the housing in different manners. EP 0 375 271 B1 discloses by way of example a housing having an electrical connecting arrangement for providing an electrical connection between a first connection site inside the housing and a second connection site outside the housing, wherein the electrical connecting arrangement includes an electrical insulating substrate that provides a seal with respect to the housing at a sealing zone and supports an electrically conductive rail, and wherein the substrate and the rail are sealed at the sealing zone in a fluid tight manner with respect to the housing.

BRIEF SUMMARY OF THE INVENTION

The object of the invention is to provide an improved housing for an electronic circuit arrangement and a method for sealing a housing for an electronic circuit arrangement. Furthermore, the object of the invention is to provide a more robust transmission control device and an improved transmission.

The object is achieved in accordance with the invention with respect to the housing, with respect to the method, with respect to the transmission control device and with respect to the transmission by the features described below.

Advantageous embodiments of the invention are the subject of the subordinate claims.

The housing in accordance with the invention for an electronic circuit arrangement comprises a housing seal that is provided on the inner face of the housing and is connected in an integrally bonded manner to at least one outer housing wall, wherein the housing seal is embodied from an elastomer that is manufactured from a liquid silicone. An electrical connecting element is guided out of the housing from the housing interior through an outer housing wall and a gap between this outer housing wall and the electrical connecting element is sealed by means of the housing seal.

It is possible by means of the electrical connecting element to connect in an advantageous manner an electronic circuit arrangement that is arranged in the housing to electrical components that are outside the housing and/or to contact said electronic circuit arrangement from the outside. By virtue of sealing the gap between the outer housing wall and the electrical connecting element, harmful materials are prevented from penetrating the housing. An electrical connecting element is by way of example a stamped grid.

Owing to the fact that stamped grids are simple and cost-effective to produce and can be adapted with regard to their geometric shape, they are particularly well suited for use as electrical connecting elements.

The term 'liquid silicone' is understood in this case to be a so-called liquid silicone rubber (LSR) that cures under the influence of heat to become an elastomer.

The housing seal renders it possible to protect an electronic circuit arrangement against damaging environmental influences, such as for example transmission oil and consequently for said circuit arrangement to be arranged in transmissions. The use of elastomers that have a Shore A hardness in the range of 30-80 renders it possible in an advantageous manner to seal the housing itself and to seal the leadthroughs for electrical connecting elements with elastomers that are in each case suitable for the purpose and as a consequence achieve a particularly good sealing effect. Owing to their material characteristics and flexible usability, liquid silicones are particularly well suited for manufacturing the housing seal.

One embodiment of the invention provides that the housing seal seals a wall space between the outer housing walls of the housing.

As a consequence, it is possible to seal those zones that are particularly relevant as far as a sealing arrangement is concerned and in which outer housing walls are adjacent to one other.

A further embodiment of the invention provides at least one inner housing wall that is arranged in the housing interior and is connected in an integrally bonded manner to the housing seal.

As a consequence, the housing and the housing seal can be stabilized in an advantageous manner.

A further development of this embodiment provides that the housing seal fills at least in part an intermediate space between an inner housing wall and an outer housing wall.

In this manner, a receptacle for the housing seal is created in the housing interior and said receptacle facilitates in an advantageous manner the production of the housing seal and increases the stability of the housing and the housing seal.

In the case of the method in accordance with the invention for sealing a housing for an electronic circuit arrangement, the housing is sealed on the inner face of the housing by a housing seal. The housing seal is connected in an integrally bonded manner to at least one outer housing wall and comprises at least one sealing region that is embodied from an elastomer, wherein the elastomer is injection molded from a liquid silicone.

Simultaneously, a gap is sealed between an outer housing wall and an electrical connecting element that is guided out of the housing from the housing interior through an outer housing wall.

By virtue of the housing seal, a housing is produced that comprises the advantages that are already mentioned above. The characteristics of liquid silicones are exploited when producing the elastomers by means of injection molding and it is consequently possible to produce suitably embodied housing seals.

A transmission control device in accordance with the invention comprises a housing that is in accordance with the invention and comprises an electrical connecting element that is guided out of said housing, an electronic circuit arrangement that is arranged in the housing and at least one electrical component that is arranged outside the housing, wherein the at least one electrical connecting element of the housing electrically connects the electronic circuit arrangement to at least one electrical component that is arranged outside the housing.

By virtue of sealing the housing, it is possible to install the housing in an advantageous manner directly in a transmission itself, as a result of which installation space is saved and costs reduced.

Accordingly, a transmission in accordance with the invention comprises a transmission control device of this type, wherein the housing of the transmission control device is arranged in a section of the transmission that contains a transmission oil.

The housing protects the electronic circuit arrangement in an advantageous manner against the penetration of transmission oil.

BRIEF DESCRIPTION OF THE SEVERAL VIEWS OF THE DRAWING

Exemplary embodiments of the invention are further explained hereinunder with reference to drawings, in which.

DESCRIPTION OF THE INVENTION

Figure 1:
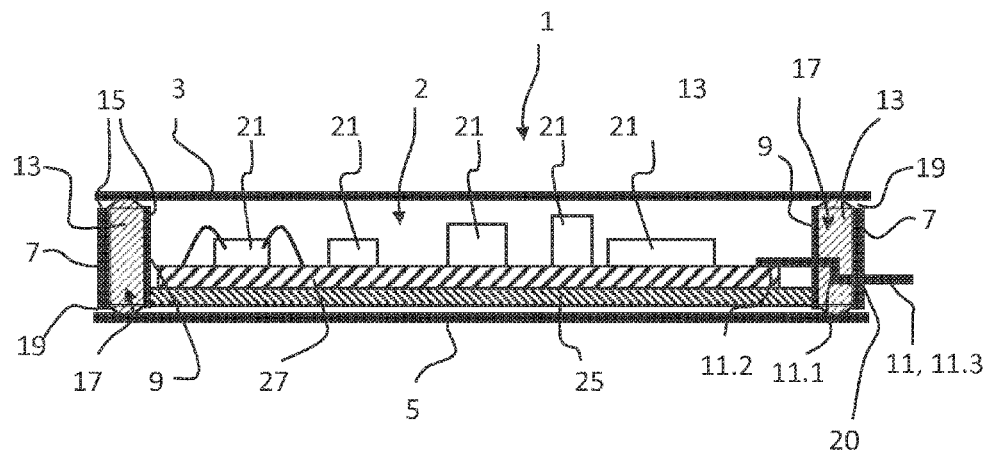
FIG. 1 illustrates a cross-sectional view of a housing and an electronic circuit arrangement that is arranged in said housing.

Parts that correspond with one another are provided in the figures with identical reference numerals.

FIG. 1 illustrates schematically a cross-sectional view of a first exemplary embodiment of a housing 1 and an electronic circuit arrangement 2 that is arranged in said housing.

The housing 1 comprises outer housing walls 3, 5, 7, an inner housing wall 9, an electrical connecting element 11 and a housing seal 13.

A first outer housing wall 3 is embodied as a housing cover, a second outer housing wall 5 is embodied as a housing base and a third outer housing wall 7 is embodied as a housing side wall between the first outer housing wall 3 and the second outer housing wall 5. The inner housing wall 9 extends in the housing interior parallel and adjacent to the third outer housing wall 7 and together with the third outer housing wall 7 forms a double wall 15 of the housing 1. The inner housing wall 9 and the third outer housing wall 7 are fixedly connected to one another by means of cross pieces (not illustrated) and are manufactured in each case from a synthetic material.

The electrical connecting element 11 is embodied as a stamped grid and is guided out of the housing 1 from the housing interior through the inner housing wall 9 and through the third outer housing wall 7 and consequently through the double wall 15. In the housing interior, the electrical connecting element 11 is electrically connected to the electronic circuit arrangement 2. In an intermediate space 17 between the third outer housing wall 7 and the inner housing wall 9, the electrical connecting element 11 comprises a region 11.1 that has a double bend so that an end 11.2 of the inner housing face of the electrical connecting element 11 extends in a plane that is offset in a parallel manner with respect to a plane in which an end 11.3 of the outer housing face of the electrical connecting element 11 extends. In an advantageous manner, the double-bend region 11.1 renders it difficult for the electrical connecting element 11 to become displaced.

The housing seal 13 fills the inner space of the double wall 15, in other words the intermediate space 17 between the third housing wall 7 and the inner housing wall 9 and extends from this inner space outwards as far as the first outer housing wall 3 and as far as the second outer housing wall 5. The housing seal 13 is connected in an integrally bonded manner to the outer housing walls 3, 5, 7, and the inner housing wall 9, so that the housing seal 13 seals the wall spaces 19 between the third outer housing wall 7 and the first outer housing wall 3 and between the third outer housing wall 7 and the second outer housing wall 5. Furthermore, the housing seal 13 in the inner space of the double wall 15 encompasses the electrical connecting element 11 in an integrally bonded manner and seals a narrow gap 20 between the third outer housing wall 7 and the electrical connecting element 11.

The housing seal 13 is embodied from an elastomer that is manufactured from a liquid silicone. The elastomer is manufactured from a liquid silicone that has a Shore A hardness in the range of 30-80.

The electronic circuit arrangement 2 is embodied as a circuit board having a base plate 25 that supports a substrate 27 and electronic components 21 that are arranged on said substrate 27.

Figure 2:
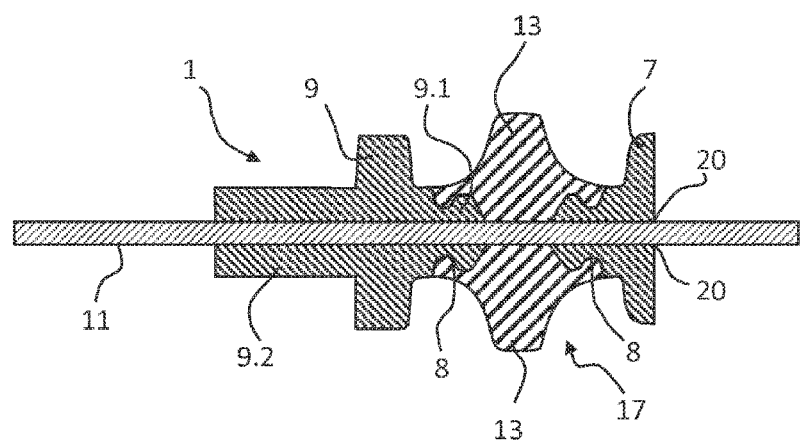
FIG. 2 illustrates a cross-sectional view of a section of a housing that comprises an electrical connecting element and a housing seal.

FIG. 2 illustrates a cross sectional view of a section of a second exemplary embodiment of a housing 1 having an electrical connecting element 11 and a housing seal 13.

The housing 1 of this exemplary embodiment comprises likewise outer housing walls 3, 5, 7, an inner housing wall 9, an electrical connecting element 11 and a housing seal 13, wherein a first outer housing wall 3 is embodied as a housing cover, a second outer housing wall 5 is embodied as a housing base and a third outer housing wall 7 is embodied as a housing side wall. The first outer housing wall 3 and the second outer housing wall 5 are embodied in a similar manner to the first exemplary embodiment that is illustrated in FIG. 1 and therefore not illustrated again in FIG. 2. Furthermore, as in the first exemplary embodiment, an electronic circuit arrangement 2 is arranged in the housing 1 and said electronic circuit arrangement is likewise not illustrated in FIG. 2.

The exemplary embodiment illustrated in FIG. 2 differs from the first exemplary embodiment illustrated in FIG. 1 by virtue of the embodiments of the third outer housing wall 7, the inner housing wall 9, the electrical connecting element 11 and the housing seal 13.

The electrical connecting element 11 is guided out of the housing 1, as in the first exemplary embodiment, from the housing interior through the inner housing wall 9 and through the third outer housing wall 7, however, as opposed to the first exemplary embodiment, said electrical connecting element does not comprise a double bend region 11.1 in the intermediate space 17 between the third outer housing wall 7 and the inner housing wall 9 but rather said electrical connecting element is embodied in an essentially planar manner at that site.

The third outer housing wall 7 comprises a spigot-shaped outer wall extension 7.1 that extends around the electrical connecting element 11 into the intermediate space 17 and comprises a groove 8 that extends in an annular manner at least in part around the electrical connecting element 11.

The inner housing wall 9 comprises a first inner wall extension 9.1 that is embodied in a similar manner to the outer wall extension 7.1 and extends around the electrical connecting element 11 into the intermediate space 17 and comprises a groove 8 that extends in an annular manner at least in part around the electrical connecting element 11. Furthermore, the inner housing wall 9 comprises a second inner wall extension 9.2 that extends around the electrical connecting element 11 as far as the electronic circuit arrangement 2 and advantageously stabilizes the position of the electrical connecting element 11.

The housing seal 13 is embodied from an elastomer that is manufactured from a liquid silicone. However, as opposed to the first exemplary embodiment, the housing seal 13 does not fill the entire intermediate space 17 between the third outer housing wall 7 and the inner housing wall 9.

The housing seal 13 is connected in particular in an integrally bonded manner to the outer wall extension 7.1, the inner wall extension 9.1 and the electrical connecting element 11 and seals a gap 20 between the third outer housing wall 7 and the electrical connecting element 11.

The housing seal 13 fills also in particular the grooves 8 in the outer wall extension 7.1 and the inner wall extension 9.1, as a consequence of which the connection of the housing seal 13 to the inner housing wall 9 and to the third outer housing wall 7 is advantageously improved. The housing seal 13 extends as far as the first outer housing wall 3 and the second outer housing wall 5, is connected thereto in an integrally bonded manner and as a consequence seals the wall spaces 19 not illustrated in FIG. 2 (cf. FIG. 1) between the third outer housing wall 7 and the first outer housing wall 3 and between the third outer housing wall 7 and the second outer housing wall 5.

In the exemplary embodiments that are described with reference to the FIGS. 1 and 2, the housing seal 13 is produced using an injection molding method, wherein a liquid silicone is injected into the intermediate space 17 between the third outer housing wall 7 and the inner housing wall 9. The third outer housing wall 7 and the inner housing wall 9 form a synthetic material frame for the injection molding procedure and during the injection molding procedure and the subsequent hardening of the liquid silicone are located in a heated tool. The housings 1 that are described with reference to FIGS. 1 and 2 are suitable in particular as housings 1 for an electronic circuit arrangement 2 of a transmission control device of a transmission, wherein the housing 1 is arranged in a section of the transmission that contains a transmission oil, and the electrical connecting element 11 electrically connects the electronic circuit arrangement 2 to at least one electrical component that is arranged outside the housing 1 and is part of the transmission control device, and electrically connects said electronic circuit arrangement in particular to an electrical energy supply for the electronic circuit arrangement 2. The housing seal 13 seals the housing 1 in particular with respect to the transmission oil of the transmission and consequently protects the electronic switching arrangement 2 against the influences of the transmission oil and other harmful environmental influences.

LIST OF REFERENCE NUMERALS

1 Housing
2 Electronic circuit arrangement
3 First outer housing wall
5 Second outer housing wall
7 Third outer housing wall
7.1 Outer wall extension
8 Groove
9 Inner housing wall
9.1 First inner wall extension
9.2 Second inner wall extension
11 Electrical connecting element
11.1 Double bend region
11.2 Housing-inner-face end
11.3 Housing-outer-face end
13 Housing seal
15 Double wall
17 Intermediate space
19 Wall space
20 Gap
21 Electronic component
25 Base plate
27 Substrate

The invention claimed is:

1. A housing for an electronic circuit configuration, the housing comprising:
an inner housing wall, an outer housing wall and a housing interior;
a housing seal disposed on said inner housing wall and connected in an integrally bonded manner to said outer housing wall, said housing seal being formed of an elastomer manufactured from a liquid silicone;
an electrical connecting element guided out of said housing from said housing interior through said at least one outer housing wall;
said inner housing wall having an extension extending towards said outer housing wall, said outer housing wall having an extension extending towards said inner housing wall, said electrical connecting element extending through said extension of said inner housing wall and said extension of said outer housing wall, and said housing seal surrounding said extension of said inner housing wall and said extension of said outer housing wall; and
said outer housing wall and said electrical connecting element forming a gap therebetween being sealed by said housing seal.

2. The housing according to claim 1, wherein said electrical connecting element is a stamped grid.

3. The housing according to claim 1, wherein said elastomer is manufactured from a liquid silicone having a Shore A hardness in a range of 30-80.

4. The housing according to claim 1, wherein said outer housing wall and said inner housing wall define a wall space therebetween, and said housing seal seals said wall space.

5. The housing according to claim 4, wherein said inner housing wall is disposed in said housing interior and is connected in an integrally bonded manner to said housing seal.

6. The housing according to claim 5, wherein said inner housing wall and said outer housing wall define an intermediate space therebetween, and said housing seal at least partly fills said intermediate space.

7. A transmission control device, comprising:
a housing according to claim 1;
an electronic circuit configuration disposed in said housing; and
at least one electrical component disposed outside said housing;

said at least one electrical connecting element of said housing electrically connecting said electronic circuit configuration to said least one electrical component disposed outside said housing.

8. A transmission, comprising:
a transmission section containing transmission oil; and
a transmission control device including:
   a housing according to claim 1 disposed in said transmission section,
   an electronic circuit configuration disposed in said housing, and
   at least one electrical component disposed outside said housing,
   said at least one electrical connecting element of said housing electrically connecting said electronic circuit configuration to said least one electrical component disposed outside said housing.

9. A method for sealing a housing for an electronic circuit configuration, the method comprising the following steps:
   providing the housing with an outer housing wall and an inner housing wall, wherein the inner housing wall has an extension extending towards the outer housing wall, and the outer housing wall has an extension extending towards the inner housing wall;
   providing an electrical connecting element extending through the extension of the inner housing wall and the extension of the outer housing wall;
   sealing the inner wall of the housing by using a housing seal connected in an integrally bonded manner to outer housing wall;
   sealing a gap between the outer housing wall and the electrical connecting element guided out of the housing from an interior of the housing through the outer housing wall by using the housing seal, the housing seal surrounding the extension of the inner housing wall and the extension of the outer housing wall; and
   providing the housing seal with at least one sealing region formed from an elastomer injection molded from a liquid silicone.

* * * * *